(12) United States Patent
Umemura et al.

(10) Patent No.: US 12,068,210 B2
(45) Date of Patent: Aug. 20, 2024

(54) PACKAGE SUBSTRATE AND METHOD OF MANUFACTURING THE SAME

(71) Applicant: TOPPAN PRINTING CO., LTD., Tokyo (JP)

(72) Inventors: Yuki Umemura, Tokyo (JP); Akane Kobayashi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 443 days.

(21) Appl. No.: 17/376,534

(22) Filed: Jul. 15, 2021

(65) Prior Publication Data

US 2021/0351094 A1 Nov. 11, 2021

Related U.S. Application Data

(63) Continuation-in-part of application No. PCT/JP2020/001351, filed on Jan. 16, 2020.

(30) Foreign Application Priority Data

Jan. 16, 2019 (JP) .................. 2019-005064

(51) Int. Cl.
*H01L 23/15* (2006.01)
*H05K 1/02* (2006.01)
*H05K 1/03* (2006.01)

(52) U.S. Cl.
CPC .......... *H01L 23/15* (2013.01); *H05K 1/0298* (2013.01); *H05K 1/0306* (2013.01)

(58) Field of Classification Search
CPC ............... H01L 23/15; H01L 23/49822; H01L 23/49827; H01L 23/13; H05K 1/0298; H05K 1/0306; H05K 3/0052; H05K 3/4605; H05K 3/426; H05K 3/4644; H05K 2201/09154
See application file for complete search history.

(56) References Cited

U.S. PATENT DOCUMENTS

2010/0122838 A1  5/2010  Asami et al.
2019/0162778 A1* 5/2019  Kanematsu ........ G01R 1/07378

FOREIGN PATENT DOCUMENTS

CN    101742813 A    6/2010
JP    2017-073424 A  4/2017
JP    2018-116963 A  7/2018
(Continued)

OTHER PUBLICATIONS

International Searching Authority, "International Search Report," issued in connection with International Patent Application No. PCT/JP2020/001351, dated Mar. 31, 2020.

(Continued)

*Primary Examiner* — Jonathan Han
(74) *Attorney, Agent, or Firm* — Foley & Lardner LLP

(57) ABSTRACT

A package substrate that prevents breakage of a core substrate is provided. A package substrate includes a core substrate made of a brittle material, at least one insulating layer formed on one surface or both surfaces of the core substrate, and one or more wiring layers formed on the insulating layer and/or in the insulating layer, the core substrate being exposed from an outer peripheral portion of the insulating layer, and the insulating layer being chamfered.

22 Claims, 12 Drawing Sheets

(56) References Cited

FOREIGN PATENT DOCUMENTS

WO   WO-2014/045633 A1   3/2014

OTHER PUBLICATIONS

International Searching Authority, "Written Opinion," issued in connection with International Patent Application No. PCT/JP2020/001351, dated Mar. 31, 2020.
Office Action issued in corresponding Chinese Patent Application No. 202080007990.5 dated Mar. 22, 2024 (16 pages).

* cited by examiner

PACKAGE SUBSTRATE AND METHOD OF MANUFACTURING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/001351, filed on Jan. 16, 2020, which is based upon and claims the benefit of priority to Japanese Patent Application No. 2019-005064, filed on Jan. 16, 2019; the disclosures of which are incorporated herein by reference in their entireties.

TECHNICAL FIELD

The present invention relates to a package substrate and a method of manufacturing the same.

BACKGROUND

Semiconductor package substrates are used to electrically connect semiconductor chips with motherboards. Semiconductor package substrates also have a role of bridging differences in thermal expansion coefficient between a semiconductor chip and a printed wiring board mounted with a semiconductor package to improve joint reliability in system implementation. Due to such a role, semiconductor package substrates are also referred to as interposer substrates or the like. In a semiconductor package substrate, layers having different wiring widths and pitches allow conversion between the wiring width and the wiring pitch of a semiconductor chip and the wiring width and the wiring pitch of a motherboard to establish electrical connection.

In recent years, not only a conventional SoC (System on a Chip) but also a SiP (System in Package) which implements a large-scale system in a single package has been used to develop a high-performance system in a short period of time. In a SiP, for example, a CPU and a GPU, and a plurality of semiconductor chips such as large-capacity memories are arranged next to each other on a single package substrate, or chips are stacked and arranged in a three-dimensional manner.

However, core substrates used for recent package substrates include core substrates made of a material that is brittle despite having good electrical properties (brittle material). It is known that a wiring substrate is produced by laminating, on a core substrate, two or more resin layers and wiring layers having a different linear expansion coefficient from the core substrate; thus, during temperature change, the difference in the linear expansion coefficient causes a difference in expansion amount between the resin layers, the wiring layers, and the core substrate, leading to generation of stress. When the core substrate is made of a brittle material that is easily broken, the stress may cause breakage of the core substrate (e.g., Non Patent Literature 1).

As a method to prevent such breakage of the core substrate, a structure has been proposed in which a package substrate includes a core substrate, an insulating layer formed on one surface or both surfaces of the core substrate, and one or more wiring layers formed on the insulating layer and/or embedded in the insulating layer, and an outer peripheral portion of the surface of the package substrate on which the insulating layer is formed has an exposed portion at which the core substrate is exposed (e.g., Patent Literature 1). The structure having such an exposed portion can prevent stress from occurring in a cross section of the core substrate, thereby preventing damage starting from the cross section of the core substrate.

However, such a method cannot avoid stress being applied to the surface of the core substrate, and may cause breakage starting from the surface of the core substrate.

CITATION LIST

Non Patent Literature

[NPL 1] "Empirical Investigations on Die Edge Defects Reductions in Die Singulation Processes for Glass-Panel Based Interposers for Advanced Packaging", Frank Wei et al., 2015 Electronic Components & Technology Conference (2015).

Patent Literature

[PTL 1] JP 2018-116963 A.

SUMMARY OF THE INVENTION

Technical Problem

Thus, an object of the present invention is to provide a package substrate capable of preventing damage (e.g., breakage) affecting the reliability from starting from a surface of a core substrate made of a brittle material due to temperature change or the like, and a method of manufacturing the same.

Solution to Problem

In order to solve the above problem, intensive studies have been performed on the prevention of breakage of a core substrate, in particular, breakage starting from a surface of the core substrate. As a result, it has been found that the following technique is effective.

An aspect of the present invention is a package substrate including a core substrate made of a brittle material, at least one insulating layer formed on one surface or both surfaces of the core substrate, and one or more wiring layers formed on the insulating layer and/or in the insulating layer, the core substrate being exposed outside an outer peripheral portion of the insulating layer, the insulating layer being chamfered.

Another aspect of the present invention is a method of manufacturing a package substrate, the package substrate including a core substrate made of a brittle material, at least one insulating layer formed on one surface or both surfaces of the core substrate, and one or more wiring layers formed on the insulating layer and/or in the insulating layer, the core substrate being exposed outside an outer peripheral portion of the insulating layer, the method including a step of chamfering the insulating layer.

Advantageous Effects of the Invention

The package substrate and the manufacturing method according to the present invention provide an improved and even highly reliable package substrate that prevents breakage of a core substrate.

DETAILED DESCRIPTION

Embodiments of the present invention of will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

A package substrate of the present invention is a package substrate obtained by dicing a wiring substrate composed of a laminate (buildup layer) in which an insulating layer and a wiring layer are laminated. Herein, the term "package substrate" refers to a laminate obtained by dicing a wiring substrate. Further, the term "wiring substrate" refers to connected package substrates before being diced.

First Embodiment

Figure 1:
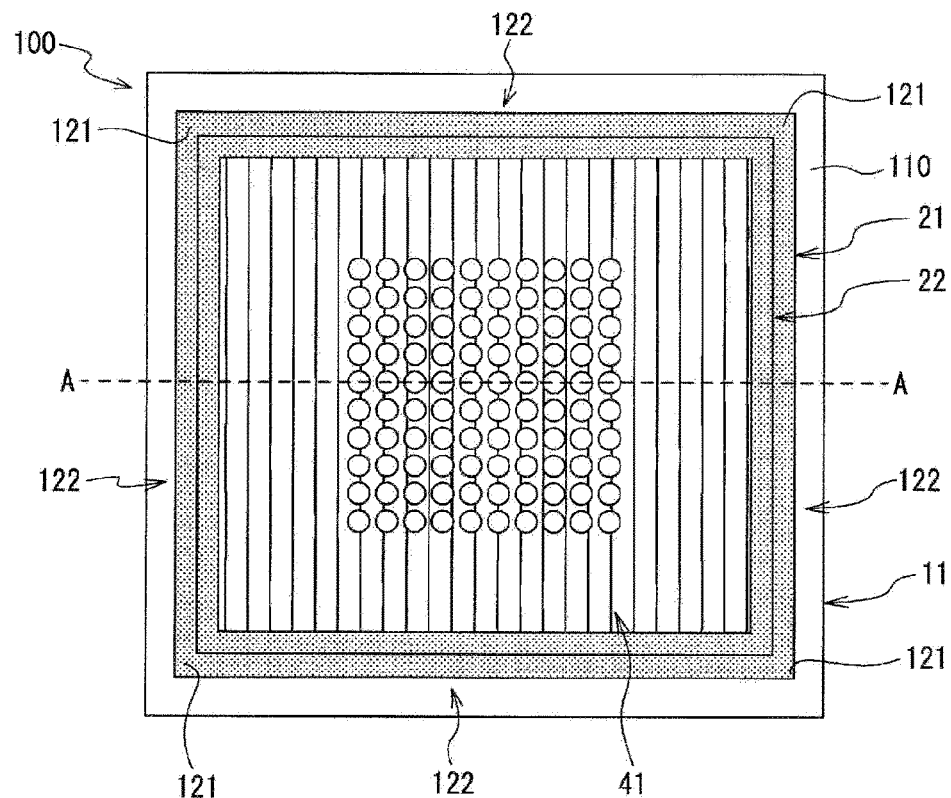
FIG. 1 is a plan view illustrating a schematic configuration of a package substrate according to a first embodiment of the present invention.
Figure 2:
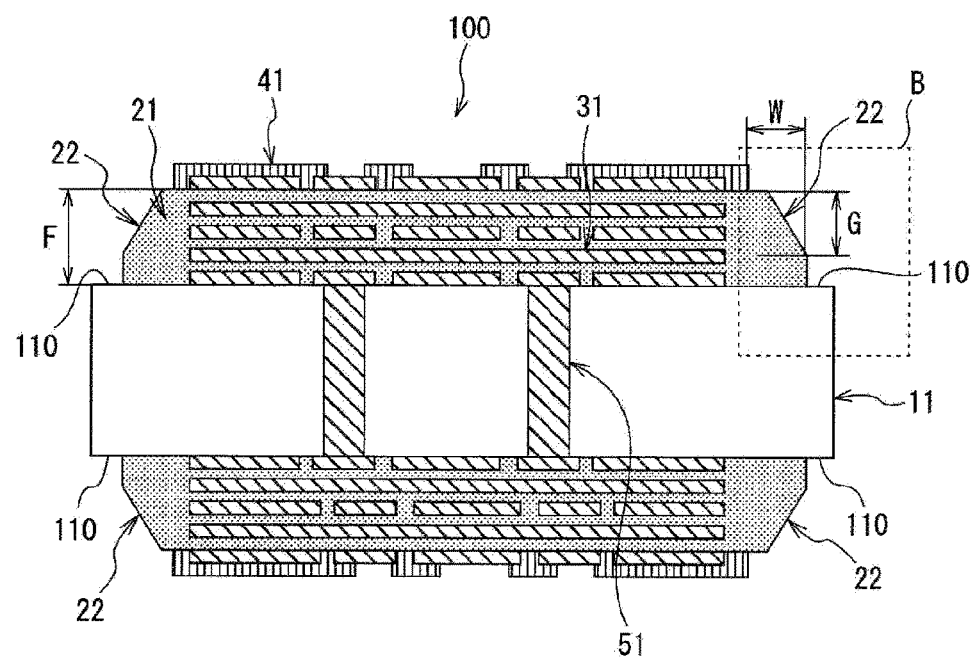
FIG. 2 is a cross-sectional view illustrating the schematic configuration of the package substrate according to the first embodiment of the present invention.

FIG. 1 is a schematic plan view of a package substrate 100 according to a first embodiment of the present invention. FIG. 2 is a schematic cross-sectional view of the package substrate 100 according to the present embodiment cut along the line A-A in FIG. 1. FIGS. 3(a)-3(d) show enlarged views of a region B indicated by the dotted line in FIG. 2.

(Package Substrate)

As shown in FIGS. 1 and 2, the package substrate 100 includes a core substrate 11, an insulating layer 21 laminated on both surfaces of the core substrate 11 in the thickness direction, and a plurality of wiring layers 31 formed on the insulating layer 21 or embedded in the insulating layer 21. In FIG. 1, the wiring layers 31 are omitted for the sake of simplification.

In the package substrate of the present invention, the structures of the insulating layer 21 and the wiring layer 31 are not limited to those shown in FIGS. 1 and 2.

The insulating layer 21 may be laminated on one of the surfaces (one surface) of the core substrate 11 in the thickness direction. That is, the insulating layer 21 is formed on one surface or both surfaces of the core substrate 11. The insulating layer 21 may be formed of a single layer or a plurality of layers.

The wiring layer 31 may be formed on the insulating layer 21 or in the insulating layer 21. That is, the wiring layer 31 is formed on the insulating layer 21 and/or embedded in the insulating layer 21. The wiring layer 31 may be formed of a single layer or a plurality of layers.

(Core Substrate)

The core substrate 11 can be made of a material that improves the electrical properties of the package substrate 100. The core substrate 11 may be made of, for example, a brittle material such as a glass substrate, silicon substrate, ceramic substrate, plastic plate, or plastic tape. Among these, a glass substrate is preferable as the material of the core substrate 11.

The glass substrate used for the core substrate 11 may be made of, for example, a soda-lime glass or aluminosilicate glass. The glass substrate used for the core substrate 11 may be surface-treated by a method generally used in the art. For example, the glass substrate may be roughened, or surface-treated with hydrofluoric acid or silicon. The glass substrate used for the core substrate 11 may have a primer layer (not shown) formed on the surface of the glass substrate. The thickness of the core substrate 11 is not particularly limited, but is preferably 50 μm or more and 800 μm or less.

In the package substrate 100, the surface of the core substrate 11 on which the insulating layer 21 is provided has an exposed portion 110 at which the core substrate 11 is exposed. As shown in FIG. 1, the exposed portion 110 corresponds to an outer peripheral portion of the core substrate 11, and the exposed portion 110 is exposed from an outer peripheral portion of the insulating layer 21 in plan view of the core substrate 11 in the thickness direction.

(Wiring Layer)

The wiring layer 31 is made of chromium, copper, silver, tin, gold, tungsten, an alloy of these metals, a conductive resin, or the like. The wiring layer 31 can be formed by using a method in which thick plating is performed, followed by a subtractive process or a semi-additive process to form a wiring, or by using a method such as an ink-jet method, screen printing, or gravure offset printing. The wiring layer 31 is preferably formed by the semi-additive method. The wiring layer 31 only needs to have a thickness, for example, in the range of 1 μm or more and 100 μm or less.

(Insulating Layer)

The insulating layer 21 can be made of an epoxy resin material, an epoxy acrylate resin, a polyimide resin, a liquid crystalline polymer resin, or the like. These insulating materials may contain a filler. The insulating material for forming the insulating layer 21 is preferably an epoxy-containing resin having a linear expansion coefficient in the range of 7 ppm/K or more and 130 ppm/K or less, which is easily available in general. The insulating material may be a liquid material or a film material. When the insulating material is a liquid, the insulating layer 21 can be formed by a method generally used in the art, such as spin coating, die coating, curtain coating, roll coating, doctor blading, or screen printing. When the insulating material is a film, the insulating layer 21 can be formed, for example, by vacuum lamination or roll lamination. The insulating layer 21 formed as described above may be cured by heating or light irradiation. The insulating layer 21 only needs to have a thickness in the range of 1 μm or more and 200 μm or less.

In the package substrate 100 according to the present embodiment, an edge portion of the insulating layer 21 is chamfered. A chamfered region of the insulating layer 21 is referred to as a chamfered portion. Thus, the insulating layer 21 is provided with a chamfered portion 22. The chamfered portion refers to, for example, a structure in which part of the edge portion of the insulating layer 21 is removed as observed in the cross-sectional direction shown in FIG. 2. A chamfer direction of the chamfered portion 22 is a direction in which the insulating layer 21 is laminated on the core substrate 11, i.e., the thickness direction of the core substrate 11.

In the package substrate 100, as shown in FIG. 2, a height G of the chamfered portion 22 of the insulating layer 21 is in the range of 30% or more and less than 100% of a thickness F of the insulating layer 21.

In a process of manufacturing the package substrate 100 according to the present embodiment, a volume of the portion of the insulating layer 21 chamfered to form the chamfered portion 22 is preferably 30% or more of a volume of a region of the insulating layer 21 in which a distance W parallel to a surface of the insulating layer 21 from an edge of the insulating layer 21 before being chamfered toward a center portion of the insulating layer 21 is not more than the thickness F of the insulating layer 21 (a region in which distance W≤thickness F).

As shown in FIG. 1, in the present embodiment, the chamfered portion 22 is provided on an outer periphery of the insulating layer 21. In the present embodiment, the insulating layer 21 has a rectangular shape in plan view, and has four corner portions 121, and four linear portions 122 connecting the four corner portions and constituting the four sides of the rectangular shape in plan view. The four linear portions 122 correspond to the outer periphery of the insulating layer 21. That is, the chamfered portion 22 is provided in the linear portion 122 of the insulating layer 21 in plan view. In the package substrate 100 according to the present embodiment, the chamfered portion 22 is provided on the entire outer periphery of the insulating layer 21, i.e., in the four linear portions 122, but the present invention is not limited to this. The chamfered portion 22 may be formed, for example, on part of the outer periphery of the insulating layer 21. The chamfered portion 22 may be formed, for example, in at least one of the four linear portions 122, or in part of each of the linear portions 122.

The advantage of the structure of the package substrate 100 of the present embodiment is that the edge portion of the insulating layer 21 is chamfered, and the chamfered portion 22 may have various shapes.

Figure 3A:
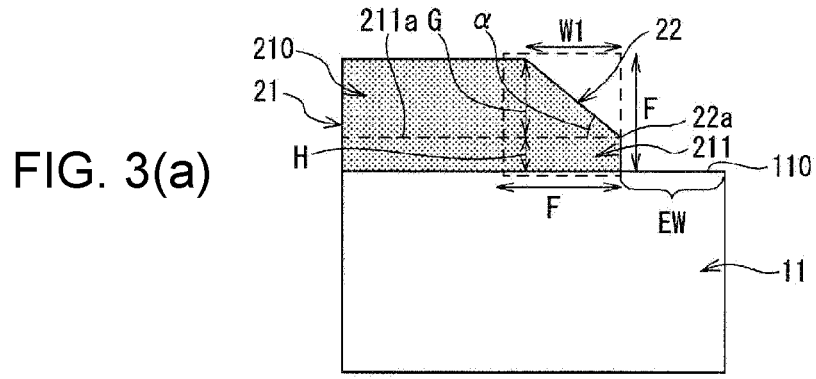
FIGS. 3(a)-3(d) show enlarged cross-sectional views illustrating schematic configurations of the package substrate according to the first embodiment of the present invention.
Figure 3B:
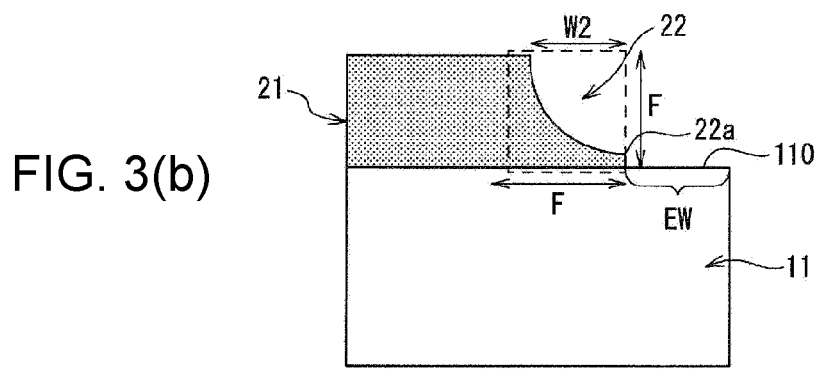

The shape of the chamfered portion 22 may be, for example, a shape obtained by chamfering the insulating layer 21 in a linear shape (a linear shape) as shown in FIG. 3(a), or a shape obtained by chamfering the insulating layer 21 in a shape having a curvature (a curved shape) as shown in FIG. 3(b). In the chamfered portions 22 shown in FIGS. 3(a) and (b), distances W1 and W2, respectively, from the edge of the insulating layer 21 are both not more than the thickness F of the insulating layer 21.

Figure 3C:
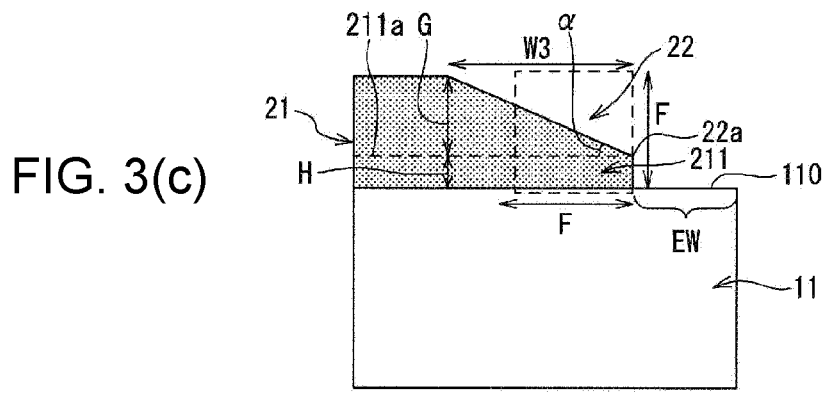

As shown in FIG. 3(c), the chamfered portion 22 may be formed by chamfering the insulating layer 21 to such an extent that a distance W3 from the edge of the insulating layer 21 before being chamfered exceeds the thickness F of the insulating layer 21.

In the present embodiment, when the chamfered portion 22 has a linear shape (see FIGS. 3(a) and (c)), the insulating layer 21 may have a first portion 210 and a second portion 211. In this case, the first portion 210 of the insulating layer 21 includes the chamfered portion 22. That is, the chamfered portion 22 is formed on an outer periphery of the first portion 210 of the insulating layer 21. The first portion 210 is a portion of the insulating layer 21 corresponding to a portion having the height G of the chamfered portion 22 of the thickness F of the insulating layer 21 in cross section.

The second portion 211 of the insulating layer 21 is a portion of the insulating layer 21 corresponding to a portion having a thickness H in cross section. The thickness H is a thickness of the remaining portion obtained by removing the chamfered portion 22 having the height G from the insulating layer 21 having the thickness F (thickness H=thickness F−height G). That is, the portion of the insulating layer 21 other than the first portion 210 corresponds to the second portion 211. As shown in FIGS. 3(a) and (c), the second portion 211 of the insulating layer 21 is located between the first portion 210 and the core substrate 11. For ease of understanding, in FIGS. 3(a) and (c), a virtual surface 211a of the second portion 211 is shown at a boundary between the first portion 210 and the second portion. Thus, in the package substrate 100 according to the present embodiment, the insulating layer 21 may have the first portion 210 including the chamfered portion 22, and the second portion 211 located between the first portion 210 and the core substrate 11.

The insulating layer 21 has a structure in which the first portion 210 and the second portion 211 are stacked. For example, in the insulating layer 21 shown in FIGS. 3(a) and (c), the second portion 211 is arranged below the first portion 210 including the chamfered portion 22. Accordingly, the first portion 210 is raised by the thickness H in the thickness direction from the exposed portion 110 of the core substrate 11. Thus, there is a distance corresponding to the thickness H, i.e., the thickness of the second portion 211 of the insulating layer 21, between a lower end 22a of the chamfered portion 22 and the exposed portion 110 of the core substrate 11. During chamfering processing in the process of manufacturing the package substrate 100, the second portion 211 having the thickness H is left in the insulating layer 21, and this can prevent, for example, a blade used for the chamfering processing from coming into contact with the core substrate 11. That is, in the package substrate 100 according to the present embodiment, since the insulating layer 21 has the second portion 211, it is possible to prevent the occurrence of cracking or damage in the core substrate 11 during the chamfering processing or the like. The first portion 210 of the insulating layer 21 may be referred to as a chamfer formation portion. The second portion 211 of the insulating layer 21 may be referred to as a remaining portion, or may be referred to as a base or a base portion.

The first portion 210 and the second portion 211 of the insulating layer 21 may be formed as a single layer, that is, may be integrally formed. Alternatively, the first portion 210 and the second portion 211 of the insulating layer 21 may be formed as separate layers. When the first portion 210 and the second portion 211 are separate layers, each of the first portion 210 and the second portion 211 may be a single layer, or may have a structure in which a plurality of layers are laminated.

In the package substrate 100 according to the present embodiment, the thickness H, which is the thickness of the second portion 211 of the insulating layer 21, may be in the range of 1 μm or more and 50 μm or less. The thickness H of the second portion 211 is preferably in the range of 2.5 μm or more and 30 μm or less, and more preferably in the range of 5 μm or more and 15 μm or less. For example, if the thickness H of the second portion 211 is less than 1 μm, cracks may occur in the resin constituting the insulating layer 21, and the cracks may propagate to the core substrate 11. For example, if the thickness H of the second portion 211 is 0 μm or less, a blade used for the chamfering processing may come into contact with the core substrate 11 and causes cracking or damage in the core substrate 11 during chamfering processing in which the chamfered portion 22 of the insulating layer 21 is formed. Thus, in the case where no second portion is provided in the insulating layer 21 having the chamfered portion 22 having a linear shape, a non-defective rate (here, a ratio of the number of non-defective products to the number of manufactured products) during manufacturing of the package substrate 100 is reduced as compared with the case where the second portion 211 is provided in the insulating layer 21. Furthermore, for example, if the thickness of the second portion 211 exceeds 50 μm, the package substrate 100 may not have a sufficient stress relaxation effect (an effect of relaxing stress concentration on the surface of the core substrate 11), and breakage (e.g., back breakage) may occur in the core substrate 11.

An angle α shown in FIGS. 3(a) and (c) corresponds to a chamfer angle which is an angle of the chamfered portion 22 relative to the virtual surface 211a of the second portion 211 of the insulating layer 21. In the present embodiment, the angle α may be 70° or less. The angle α is preferably 50° or less, and more preferably 30° or less. For example, if the angle α exceeds 70°, no stress relaxation effect of the package substrate 100 can be expected. The lower limit of the angle α is assumed to be, for example, approximately 10° due to the limitations of a device used for chamfering processing, or the like.

When the chamfered portion 22 has a curved shape as shown in FIG. 3(b), the insulating layer 21 also remains between the lower end of the chamfered portion 22 and the core substrate 11, and the lower end 22a of the chamfered portion 22 is not in contact with the core substrate 11. This makes it possible to avoid a blade (e.g., dicing blade) coming into contact with the core substrate 11 during chamfering processing for forming the chamfered portion 22 having a curved shape. Thus, the package substrate 100 in which the chamfered portion 22 has a curvature shape has the stress relaxation effect, and can prevent a reduction of the non-defective rate during manufacturing of the package substrate 100 as with the package substrate 100 in which the insulating layer 21 has the second portion 211 (see FIGS. 3(a) and (c)). The shape of the chamfered portion 22 is not limited to these shapes.

Figure 3D:
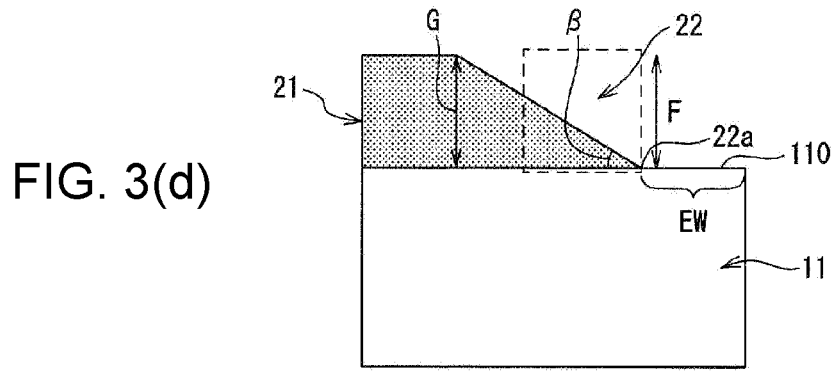

For example, as shown in FIG. 3(d), when the chamfered portion 22 has a linear shape, the insulating layer 21 may not necessarily have the second portion 211. That is, the height G of the chamfered portion 22 may be equivalent to the thickness F of the insulating layer 21. In this case, the insulating layer 21 is formed so that the lower end 22a of the chamfered portion 22 is in contact with the core substrate 11. When the package substrate 100 includes the insulating layer 21 having the shape shown in FIG. 3(d), the package substrate 100 also has the stress relaxation effect. Thus, due to the insulating layer 21 that is chamfered, the package substrate 100 has the effect of relaxing stress concentration. As described above, the insulating layer 21 having the chamfered portion 22 having a linear shape is preferably provided with the second portion 211 from the viewpoint of preventing a reduction of the non-defective rate during manufacturing of the package substrate 100.

An angle β shown in FIG. 3(d) corresponds to a chamfer angle which is an angle of the chamfered portion 22 relative to the surface of the core substrate 11. As with the angle α described above (see FIGS. 3(a) and (c)), the angle β may be 70° or less, and is preferably 50° or less, and more preferably 30° or less.

As shown in FIGS. 3(a) to (d), the exposed portion 110 of the core substrate 11 has a predetermined exposure width EW. In the present embodiment, the exposure width EW may be in the range of 50 μm or more and 150 μm or less. If the exposure width EW is less than 50 for example, during temperature change, breakage (e.g., back breakage) may occur in the core substrate 11. If the exposure width EW exceeds 150 during manufacturing of the package substrate 100, removal of the insulating layer 21 on the core substrate 11 requires time and effort, resulting in a long working time for the step of forming the exposed portion 110. Thus, in the case where the exposure width EW exceeds 150 the time required to manufacture the package substrate 100 is increased, leading to a reduction in efficiency of manufacturing the package substrate 100, as compared with the case where the exposure width EW is less than 150 μm.

As described above, the package substrate 100 according to the present embodiment includes the core substrate 11 made of a brittle material, at least one insulating layer 21 formed on one surface or both surfaces of the core substrate 11, and one or more wiring layers 31 formed on the insulating layer 21 and/or in the insulating layer 21, and the core substrate 11 is exposed on the outer peripheral portion of the insulating layer 21, and the insulating layer 21 is chamfered.

This allows the package substrate 100 to disperse the stress applied to the portion near the edge portion of the insulating layer 21, specifically, the surface of the core substrate 11 immediately below the edge portion of the insulating layer 21, thereby relaxing stress concentration. Thus, the package substrate 100 is configured to prevent breakage starting from the surface of the core substrate 11.

In the package substrate 100 according to the present embodiment, the volume of the portion of the insulating layer 21 removed during formation of the chamfered portion 22 is referred to as a chamfer volume. Furthermore, the region of the insulating layer 21 in which the distance W in the plane direction from the edge portion of the insulating layer 21 before being chamfered toward the center portion of the insulating layer 21 is not more than the thickness F of the insulating layer 21 is referred to as a specific region. The distance W is, for example, a distance between the edge portion of the insulating layer 21 before being chamfered and an upper edge of the chamfered portion 22. In the package substrate 100 according to the present embodiment, the chamfer volume of the insulating layer 21 is preferably 30% or more of the volume of the specific region described above.

This can avoid a reduction in the stress relaxation effect due to variation in the shape of the chamfered portion 22.

The brittle material for forming the core substrate 11 is preferably glass. Thus, the package substrate 100 according to the present embodiment is more likely to have the effect of relaxing stress concentration on the surface of the core substrate 11.

Other than the components described above, FIGS. 1 and 2 show an outer layer insulating resin 41 provided on the surface of the package substrate 100 in the thickness direction and a through hole 51 provided in the core substrate 11. In the present embodiment, these components are not essential, and may or may not be included in the package substrate 100.

Second Embodiment

Figure 4:
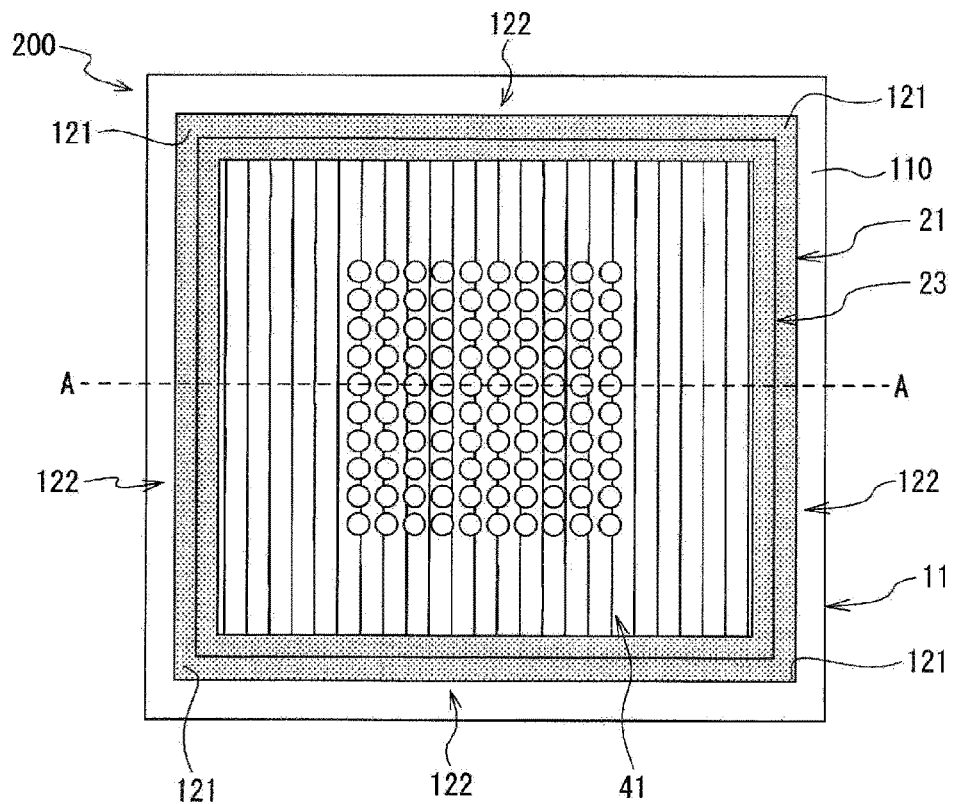
FIG. 4 is a plan view illustrating a schematic configuration of a package substrate according to a second embodiment of the present invention.
Figure 5:
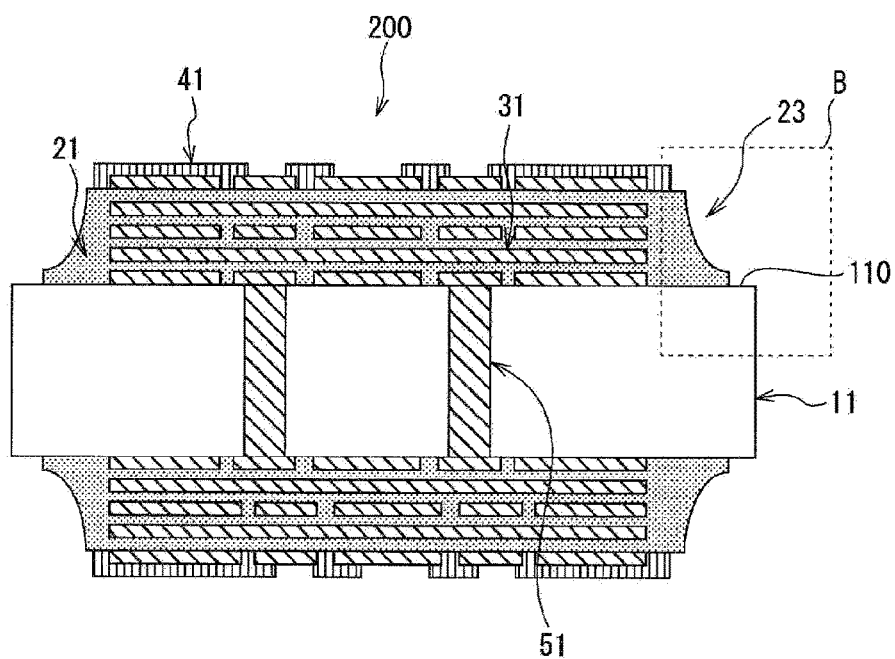
FIG. 5 is a cross-sectional view illustrating the schematic configuration of the package substrate according to the second embodiment of the present invention.

FIG. 4 is a schematic plan view of a package substrate 200 according to a second embodiment of the present invention. FIG. 5 is a schematic cross-sectional view of the package substrate 200 cut along the line A-A in FIG. 4. FIGS. 6(a)-6(d) show enlarged views of a region B indicated by the dotted line in FIG. 5.

As shown in FIGS. 4 to 6, as in the first embodiment, the package substrate 200 according to the present embodiment includes the core substrate 11, the insulating layer 21 formed on one surface or both surfaces of the core substrate 11 in the thickness direction, and one or more wiring layers 31 formed on the insulating layer 21 and/or embedded in the insulating layer 21. In the package substrate 200, as with the package substrate 100 according to the first embodiment, the exposed portion 110 of the core substrate 11 is exposed from the outer peripheral portion of the insulating layer 21. In the description of the package substrate 200 according to the present embodiment, components common to those of the package substrate 100 described above are denoted by the same reference signs, and detailed description thereof will be omitted.

The insulating layer 21 of the package substrate 200 according to the present embodiment is provided with a chamfered portion 23.

As shown in FIG. 5, in the package substrate 200 according to the present embodiment, at least part of the insulating layer 21 (a portion corresponding to the chamfered portion 23 in the example) has an arc shape having a curvature in cross section. This allows the package substrate 200 to effectively disperse the stress on the surface of the core substrate 11 to relax stress concentration.

A curvature radius R of the chamfered portion 23 having an arc shape may be in the range of 10 μm or more and 300 μm or less. The curvature radius R is preferably in the range of 20 μm or more and 150 μm or less, and more preferably in the range of 30 μm or more and 60 μm or less. For example, if the curvature radius R exceeds 300 μm, a joint between the linear portion 122 and the corner portion 121 of the insulating layer 21 has an angular shape instead of a smooth shape. Thus, the stress may be concentrated on the corner portion 121 of the insulating layer 21, thereby causing cracks in the resin constituting the insulating layer 21. In order to form a shape having a curvature radius R exceeding 300 μm, a special blade is required to be manufactured, leading to higher production cost for the package substrate 100. Furthermore, if the curvature radius R is less than 10 μm, the stress may be concentrated on a portion of the chamfered portion 23 having the curvature radius R, thereby causing cracks in the resin constituting the insulating layer 21.

When a ratio between the curvature radius R of the chamfered portion 23 having an arc shape and the thickness of the insulating layer 21 is 1/20 or less, cracks may occur on the curved surface of the resin constituting the insulating layer 21, and the cracks cause breakage starting from the exposed glass surface of the core substrate 11.

Thus, in the package substrate 200 according to the present embodiment, the curvature radius R of the chamfered portion 23 is preferably 1/20 or more of the thickness F of the insulating layer 21. This allows the package substrate 200 to relax stress concentration on the arc-shaped portion of the insulating layer 21 corresponding to the chamfered portion 23. This can prevent a situation where the resin is damaged at the curvature portion of the insulating layer 21 and the glass constituting the core substrate 11 is exposed, and the stress concentrated on the exposed glass surface causes breakage starting from the glass surface of the core substrate 11.

The curvature radius R is preferably 1/20 or more of the thickness F of the insulating layer 21, but is not limited to this.

Figure 6A:
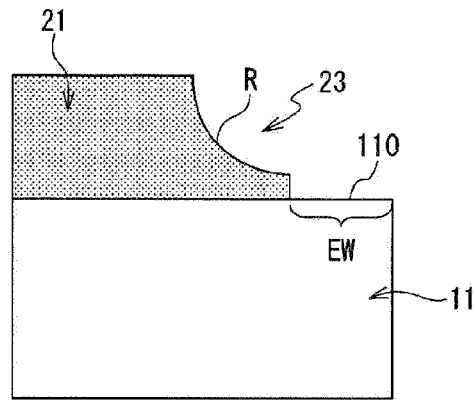
FIGS. 6(a)-6(d) show enlarged cross-sectional views illustrating schematic configurations of the package substrate according to the second embodiment of the present invention.
Figure 6B:
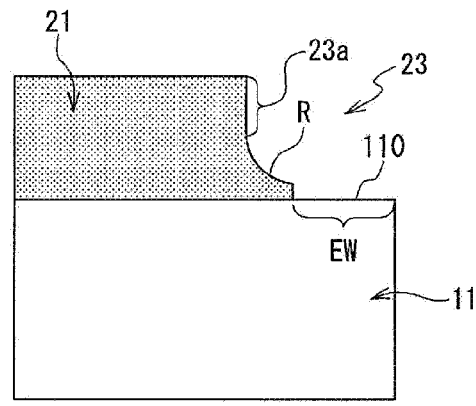

The package substrate 200 according to the present embodiment may be configured such that, as shown in FIG. 6(a), the entire portion of the chamfered portion 23 of the insulating layer 21 forms an arc, i.e., has the curvature radius R, or that, as shown in FIG. 6(b) or (c), part of a side surface of the chamfered portion 23 has a linear shape and the remaining portion has the curvature radius R.

For example, as shown in FIG. 6(b), an upper portion of the chamfered portion 23, i.e., an upper portion of the side surface of the insulating layer 21 constituting the chamfered portion 23, may have a linear shape. The upper portion of the chamfered portion 23 having a linear shape is referred to as an upper linear portion 23a. That is, the chamfered portion 23 may have the upper linear portion 23a, and a portion having the curvature radius R located lower than the upper linear portion 23a.

Figure 6C:
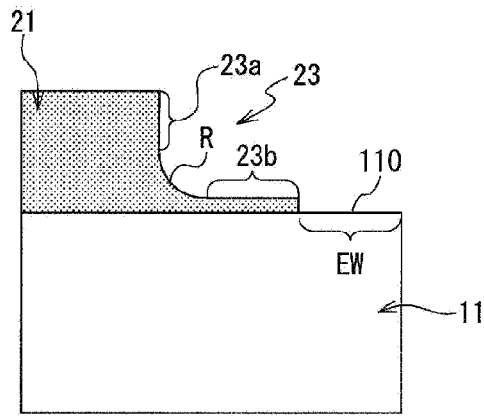

For example, as shown in FIG. 6(c), the chamfered portion 23 may have a flat portion 23b. In the chamfered portion 23, the flat portion 23b is continuous with a lower end of the arc shape having the curvature radius R, and is parallel to the core substrate 11. The flat portion 23b has a smaller thickness than the other portion of the insulating layer 21. As shown in FIG. 6(c), the chamfered portion 23 may have the upper linear portion 23a and the flat portion 23b. In this case, in the chamfered portion 23, a portion having the curvature radius R is located between the upper linear portion 23a and the flat portion 23b. Alternatively, the chamfered portion 23 may have at least one of the upper linear portion 23a and the flat portion 23b.

Figure 6D:
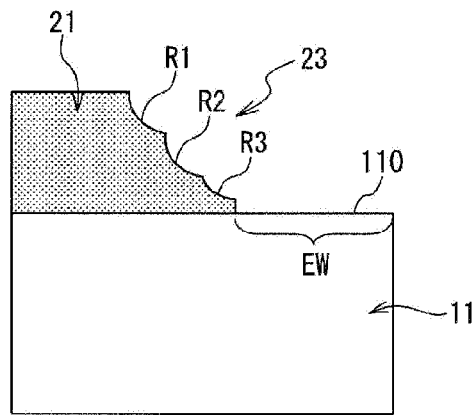

As shown in FIG. 6(d), the chamfered portion 23 may have a plurality of portions having respective curvature radii R (R1, R2, and R3 are shown as examples in FIG. 6(d)).

In the package substrate 200 according to the present embodiment, since at least part of the insulating layer 21 (the chamfered portion 23 in the example) has an arc shape in cross section, it is possible to more effectively relax stress concentration on the surface of the core substrate 11. This makes it possible to provide a package substrate in which no breakage occurs in the core substrate 11 even when the package substrate is highly multilayered. Furthermore, it is possible to provide a package substrate in which no breakage occurs in the insulating layer 21 even when the insulating layer 21 is made of a resin having high elasticity.

Third Embodiment

Figure 7:
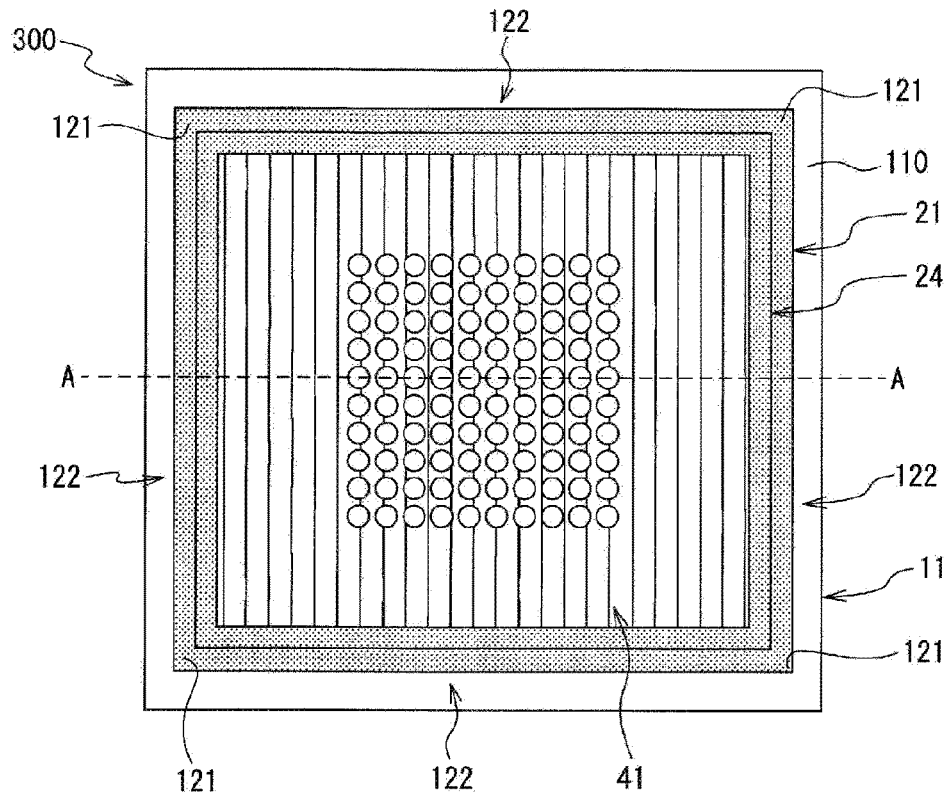
FIG. 7 is a plan view illustrating a schematic configuration of a package substrate according to a third embodiment of the present invention.
Figure 8:
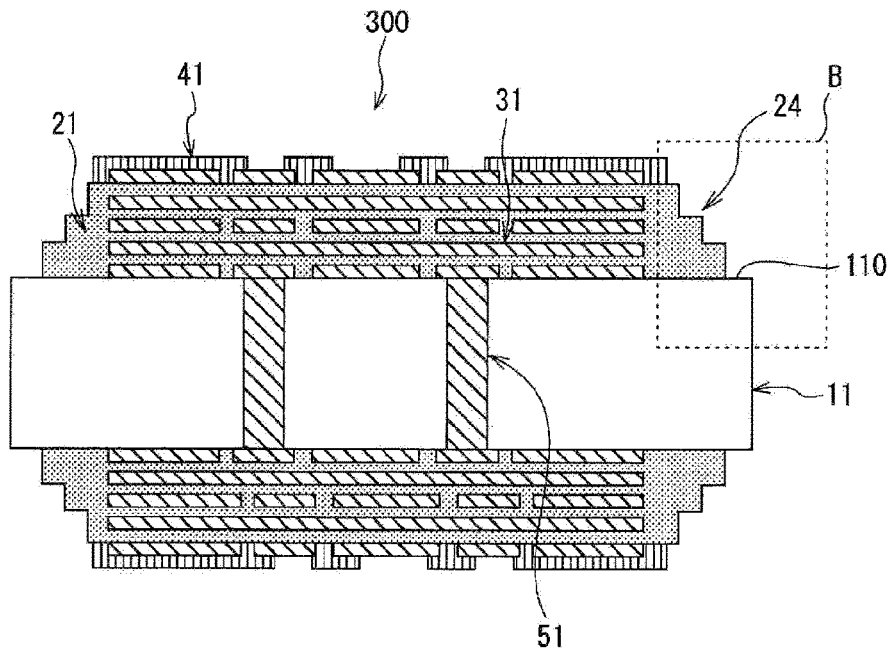
FIG. 8 is a cross-sectional view illustrating the schematic configuration of the package substrate according to the third embodiment of the present invention.
Figure 9A:
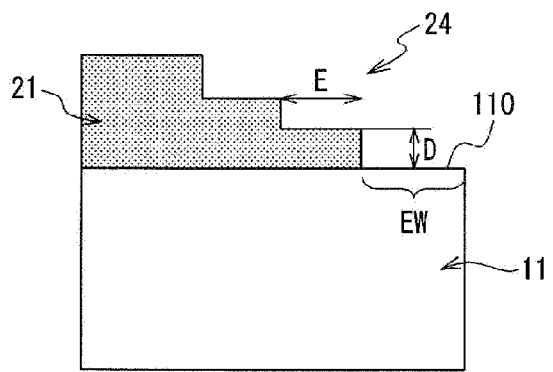
FIGS. 9(a) and 9(b) show enlarged cross-sectional views illustrating schematic configurations of the package substrate according to the third embodiment of the present invention.
Figure 9B:
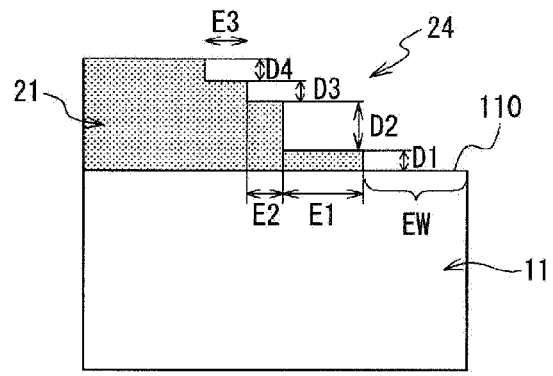

FIG. 7 is a schematic plan view of a package substrate 300 according to a third embodiment of the present invention. FIG. 8 is a schematic cross-sectional view of the package substrate 300 cut along the line A-A in FIG. 7. FIGS. 9(a) and 9(b) show enlarged views of a region B indicated by the dotted line in FIG. 8.

As shown in FIGS. 7 and 8, as in the first embodiment, the package substrate 300 according to the present embodiment includes the core substrate 11, the insulating layer 21 formed on one surface or both surfaces of the core substrate 11 in the thickness direction, and one or more wiring layers 31 formed on the insulating layer 21 and/or embedded in the insulating layer 21. In the package substrate 300, as with the package substrate 100 according to the first embodiment, the exposed portion 110 of the core substrate 11 is exposed from the outer peripheral portion of the insulating layer 21. In the description of the package substrate 300 according to the present embodiment, components common to those of the package substrate 100 described above are denoted by the same reference signs, and detailed description thereof will be omitted.

The insulating layer 21 of the package substrate 300 according to the present embodiment is provided with a chamfered portion 24.

As shown in FIGS. 8 and 9, in the package substrate 300 according to the present embodiment, at least part of the insulating layer 21 (a portion corresponding to the chamfered portion 24 in the example) has a multistage structure having two or more stages in cross section. This allows the package substrate 300 to effectively disperse the stress on the surface of the core substrate 11 to relax stress concentration.

In the multistage structure of the insulating layer 21, a thickness (thickness D in FIG. 9(a), thickness D1 in FIG. 9(b)) of a first stage from the side of the core substrate 11 made of a brittle material (e.g., glass) is preferably smaller than thicknesses of the second and subsequent stages. The thickness of the first stage from the core substrate 11 side is preferably, for example, 50 μm or less. This allows the package substrate 300 to effectively relax stress concentration on the surface of the core substrate 11 immediately below the edge portion of the insulating layer 21 to prevent the stress from being concentrated on the glass surface constituting the core substrate 11, thereby preventing breakage starting from the surface of the core substrate 11.

In the present invention, the thickness of the first stage of the multistage structure of the insulating layer 21 is not limited to 50 μm or less.

In the insulating layer 21 of the package substrate 300 according to the present embodiment, as shown in FIG. 9(a), the stages of the multistage structure corresponding to the chamfered portion 24 may have the same length E. Furthermore, the stages of the multistage structure may have the same height D. As shown in FIG. 9(b), the stages may have different lengths E (E1, E2, and E3 are shown as examples in FIG. 9(b)), and the stages may have different thicknesses D (D1, D2, D3, and D4 in FIG. 9(b)). In the multistage structure, the height D1 of the first stage is smaller than any of the height D2 of the second stage, the height D3 of the third stage, and the height D4 of the fourth stage.

In the present embodiment, when a photosensitive material is used as the insulating layer 21, there is no need to perform a separate process for forming a shape of the edge portion of the insulating layer 21. The chamfered portion 24 having a multistage structure can be formed by changing the area of the insulating layer corresponding to each stage in the multistage structure by photolithography. Regardless of whether the step of removing the edge portion of the insulating layer 21 is performed, a structure in which part of the edge portion of the insulating layer 21 appears to be removed can also be included in the chamfered portion.

Fourth Embodiment

Figure 10A:
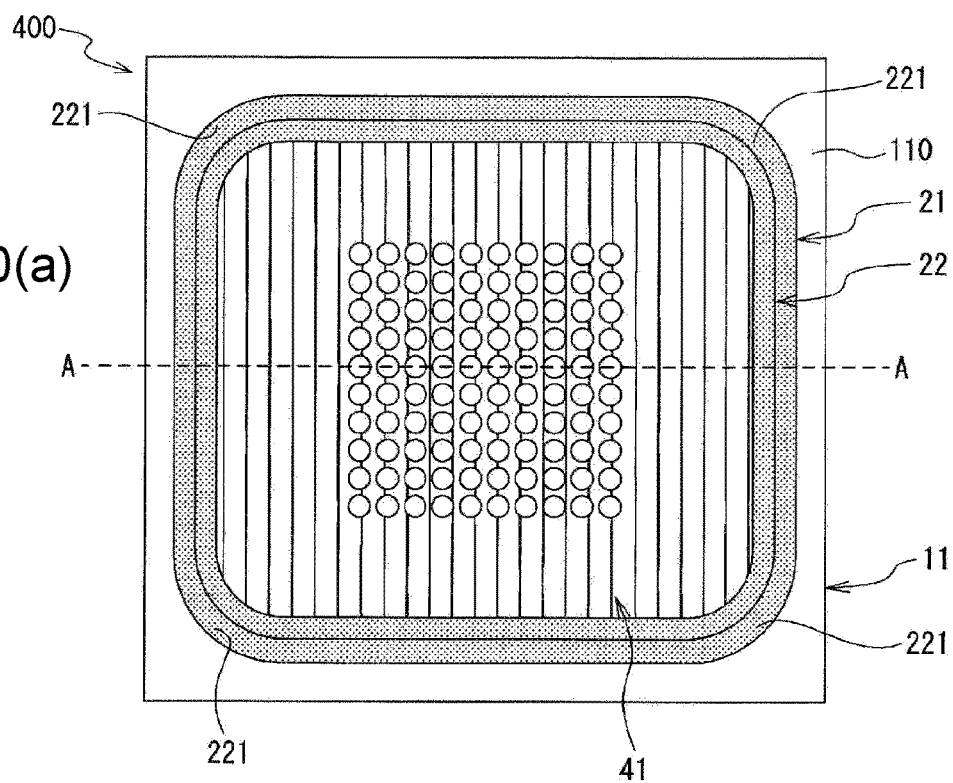
FIGS. 10(a) and 10(b) are a plan view and a cross-sectional view illustrating a schematic configuration of a package substrate according to a fourth embodiment of the present invention.
Figure 10B:
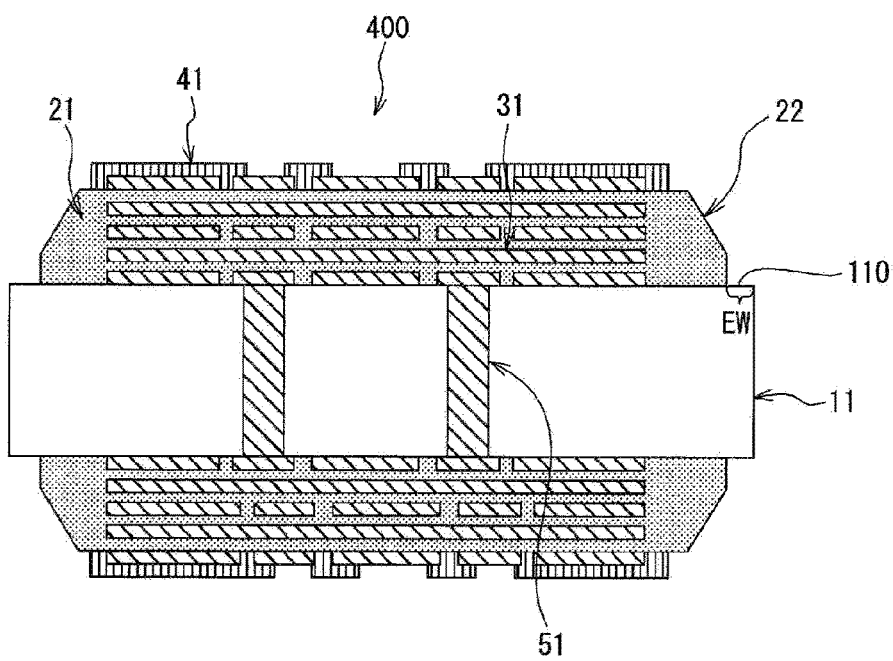

FIG. 10(a) is a schematic plan view of a package substrate 400 according to a fourth embodiment of the present invention, and FIG. 10(b) is a schematic cross-sectional view of the package substrate 400 cut along the line A-A in FIG. 10(a). In the description of the package substrate 400 according to the present embodiment, components common to those of the package substrate 100 described above are denoted by the same reference signs, and redundant description thereof will be omitted.

As shown in FIGS. 10(a) and (b), in the package substrate 400 according to the present embodiment, corner portions 221 of the insulating layer 21 have an arc shape in plan view. That is, the corner portions 221 of the insulating layer 21 have a curvature. The corner portions 221 having a curvature are formed by chamfering the four corners of the insulating layer 21 so that the corner portions 221 are along the plane of the insulating layer 21 as viewed in the thickness direction. In the package substrate 400, due to the curvature of the corner portions 221 of the insulating layer 21 at which the stress is high and breakage tends to start, it is possible to relax stress concentration specific to the corner portions. This allows the package substrate 400 to relax stress concentration on the core substrate 11 (glass in the example) immediately below an edge portion of the corner portion 221, thereby preventing breakage of the core substrate 11 starting from the corner portion 221.

Fifth Embodiment

Figure 11A:
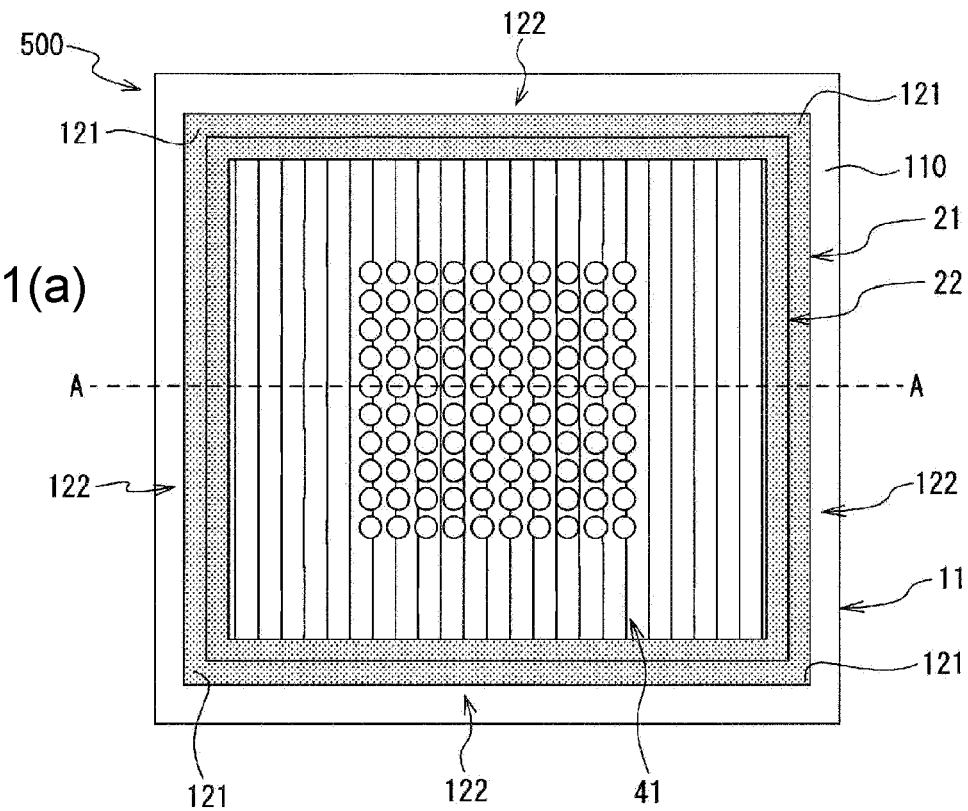
FIGS. 11(a) and 11(b) are a plan view and a cross-sectional view illustrating a schematic configuration of a package substrate according to a fifth embodiment of the present invention.
Figure 11B:
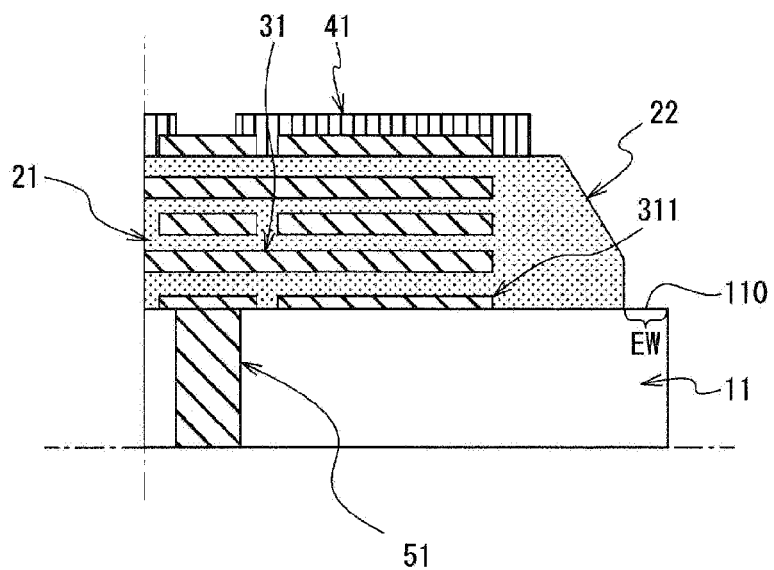

FIG. 11(a) is a schematic plan view of a package substrate 500 according to a fifth embodiment of the present invention, and FIG. 11(b) is a ¼ schematic cross-sectional view illustrating an enlarged view of a cross section of the package substrate 500 cut along the line A-A in FIG. 11(a). In the description of the package substrate 500 according to the present embodiment, components common to those of the package substrate 100 described above are denoted by the same reference signs, and redundant description thereof will be omitted.

As shown in FIG. 11(b), in the package substrate 500 according to the present embodiment, a wiring layer 311, which is part of the wiring layer 31 formed on the surface of the core substrate 11 (immediately above the core substrate 11 in the example), has a thickness of 10 μm or less. The wiring layer 311 may be formed on both surfaces or one surface of the core substrate 11 in the thickness (vertical) direction. The core substrate 11 is, for example, a glass substrate. In the package substrate 500, the wiring layer 311 on the glass surface of the core substrate 11 has a smaller thickness than the other wiring layers 31, thereby preventing minute breakage near the wiring. This makes it possible to relax the stress on the glass of the core substrate 11 immediately below the edge portion of the wiring layer 311, thereby preventing breakage of the core substrate 11 starting from the glass surface of the core substrate 11 immediately below the edge portion of the wiring layer 311.

In FIG. 11(b), the edge portion of the insulating layer 21 has the same shape as the chamfered portion 22 according to the first embodiment shown in FIG. 2 and is denoted by the same reference sign, but the shape of the edge portion of the insulating layer 21 according to the present embodiment is not limited to this. The chamfered portion of the insulating layer 21 of the package substrate 500 may have the same shape as one of the chamfered portion 22 shown in FIGS. 3(a)-3(d), the chamfered portion 23 shown in FIG. 5, the chamfered portion 23 shown in FIGS. 6(a)-6(d), and the chamfered portion 24 shown in FIGS. 9(a) and 9(b). Although not shown in FIG. 11(b), as in the first embodiment, the insulating layer 21 of the present embodiment also has the first portion 210 and the second portion 211.

EXAMPLES

The present invention and the advantageous effects thereof will be described below with reference to specific examples, but the following examples do not limit the scope of application of the present invention.

Example 1

First, a wiring substrate panel 1 shown in FIG. 12 was formed in the following procedure. In the present example, the material of the core substrate 11 was an aluminosilicate glass having a thickness of 300 μm, and the through hole 51 was formed in the core substrate 11. On each of the front and back surfaces of the core substrate 11, an adhesive layer (not shown) was formed. The adhesive layer was made of a laminate film of sputtered Ti and sputtered Cu, and had a thickness of 0.4 μm. The adhesive layer was used as a seed layer to form the wiring layer 31 having a thickness of 8 μm by electrolytic copper plating. After the wiring layer 31 was formed on the core substrate 11, an insulating material film made of an epoxy-containing thermosetting resin having a linear expansion coefficient of 23 ppm/K was laminated by vacuum lamination at 100° C. to form the insulating layer 21. At this time, the insulating layer 21 had a thickness of 25 μm.

Then, the wiring layer 31 and the insulating layer 21 were repeatedly formed to laminate five wiring layers 31 and four insulating layers 21 on each of the front and back surfaces of the core substrate 11. Thus, the insulating layers 21 including the adhesive layers had a total thickness of 132 μm. Pattern formation for the wiring layer 31 by copper plating was performed using a semi-additive method, and a laser via was formed to obtain conduction between the layers. Next, the outer layer insulating resin 41 was formed by using a photosensitive insulating resin and forming an opening in part of a connection pad or the like.

Figure 13:
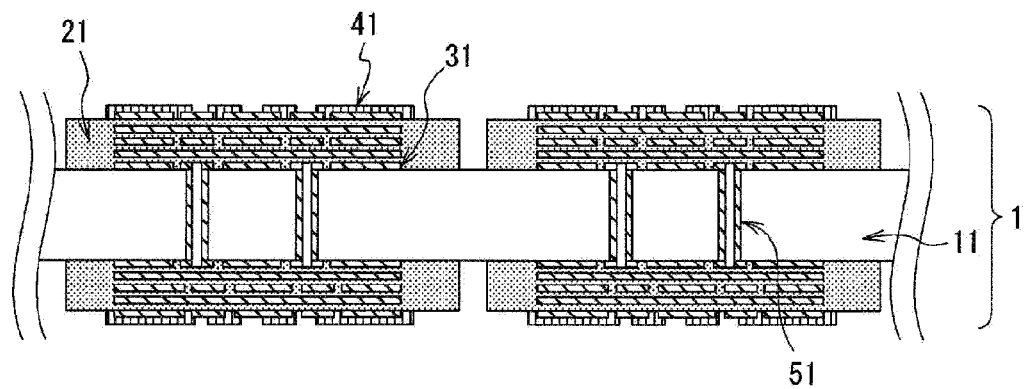
FIG. 13 is a cross-sectional view illustrating a laser processing step for the wiring substrate panel in a process of manufacturing the package substrate of Example 1.

Next, as shown in FIG. 13, the wiring substrate panel 1 was laser processed to remove a portion of the insulating layer 21 corresponding to an outer periphery of each dice to expose the core substrate 11.

Figure 14:
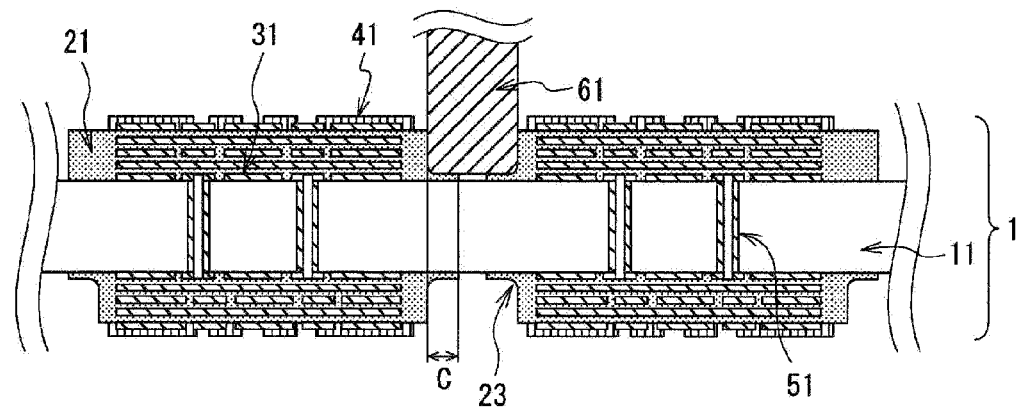
FIG. 14 is a cross-sectional view illustrating a dicing processing step for the wiring substrate panel in the process of manufacturing the package substrate of Example 1.

Next, as shown in FIG. 14, the insulating layer 21 was chamfered by dicing processing. At this time, a dicing blade 61 polished to have a rounded shape having a curvature radius of 50 μm was used. In the present example, as the dicing blade 61, an "R07-SD600-BB200 (product name), manufactured by DISCO Corporation" was used. In the present example, the front and back of the wiring substrate panel 1 were processed while a distance between the dicing blade 61 and the core substrate 11 was controlled to be in the range of 10 μm or more and 30 μm or less. In order to simultaneously process adjacent pieces in the wiring substrate panel 1, the blade width was adjusted so that a cutting width C was 100 μm or more and 300 μm or less. Thus, the desired structure was obtained at the edge portion of the insulating layer 21.

In this manner, in the present example, a chamfered shape with an arc shape having a curvature was formed at the edge portion of the insulating layer 21 by dicing blade processing. By using the dicing blade to process the shape of the edge portion of the insulating layer 21 and by controlling the shape of the dicing blade, the desired curvature radius can be obtained at the edge portion of the insulating layer 21. This allows the edge portion of the insulating layer 21 to have an arc structure capable of effectively relaxing stress concentration.

Figure 15:
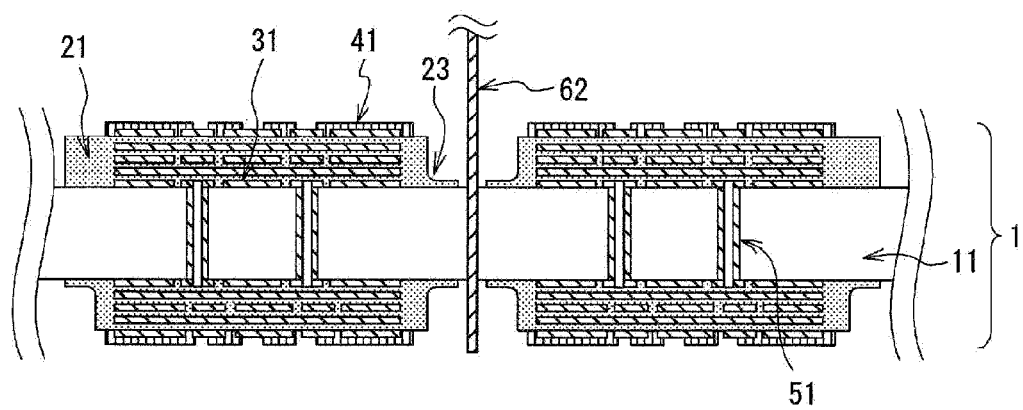
FIG. 15 is a cross-sectional view illustrating a dicing step using a dicing blade for the package substrate of Example 1.

Next, as shown in FIG. 15, the wiring substrate panel 1 was diced by using a dicing blade 62 to obtain a package substrate similar to the package substrate 200 in which the insulating layer 21 had the chamfered portion 23 having an arc shape as shown in FIG. 5. In the present example, as the dicing blade 62, an "R07-SD600-BB200 (product name), manufactured by DISCO Corporation" was used.

Example 2

Figure 16:
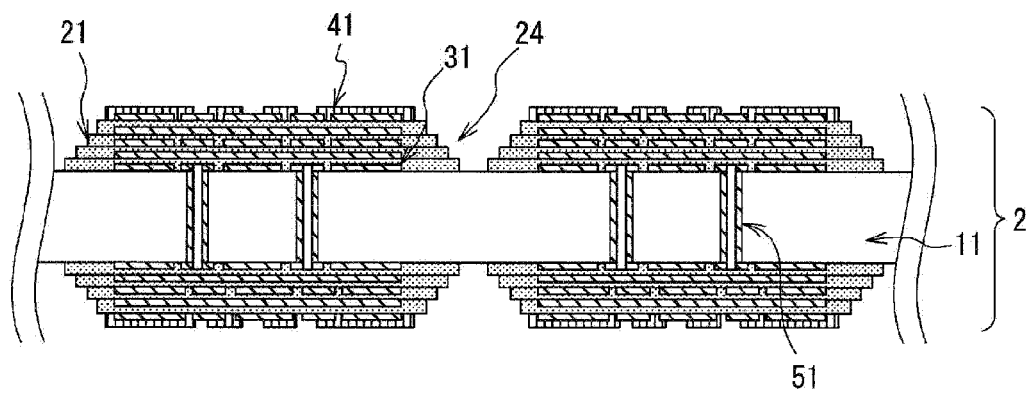
FIG. 16 is a cross-sectional view illustrating a wiring substrate panel before being diced into a package substrate of Example 2.

First, a wiring substrate panel 2 shown in FIG. 16 was formed in the following procedure. In the present example, the material of the core substrate 11 was an aluminosilicate glass having a thickness of 300 μm, and the through hole 51 was formed in the core substrate 11. On each of the front and back surfaces of the core substrate 11, an adhesive layer (not shown) was formed. The adhesive layer was made of a laminate film of sputtered Ti and sputtered Cu, and had a thickness of 0.4 μm. The adhesive layer was used as a seed layer to form the wiring layer 32 having a thickness of 8 μm by electrolytic copper plating. After the wiring layer 32 was formed on the core substrate 11, a photosensitive insulating resin film having a linear expansion coefficient of 26 ppm/K was vacuum laminated at 80° C. to form the insulating layer 21. Then, photolithography was performed to form an opening at a portion of the insulating layer 21 corresponding to an outer periphery of each dice to expose the core substrate. At this time, the insulating layer had a thickness of 25 μm.

Then, the wiring layer 31 and the insulating layer 21 were repeatedly formed to laminate five wiring layers 31 and four insulating layers 21 on each of the front and back surfaces of the core substrate 11. The insulating layers 21 were formed so that each time an insulating layer 21 was formed, the insulating layer 21 had a width smaller by 40 μm on each side than the previous insulating layer 21. Thus, as shown in FIG. 16, a multistage structure was obtained at the edge portions of the insulating layers 21. Pattern formation for the wiring layer 31 by copper plating was performed using a semi-additive method, and an opening for obtaining conduction between the layers was formed simultaneously when the outer periphery of the piece was exposed. Next, the outer layer insulating resin 41 was formed by using a photosensitive insulating resin and forming an opening in part of a connection pad or the like.

Next, as in Example 1, the wiring substrate panel 2 was diced by using the dicing blade 62 to obtain a package substrate similar to the package substrate 300 shown in FIG. 8.

In the present example, as described above, the edge portions of the insulating layers 21 were formed having a multistage structure by forming the insulating layers 21 by photolithography using the photosensitive resin to form the insulating layers 21 so that the insulating layers 21 had different resin formation areas. This makes it possible to obtain the desired multistage structure at the edge portions of the insulating layers 21, thereby allowing the edge portions of the insulating layers 21 to have the multistage structure capable of effectively relaxing stress concentration.

Example 3

Figure 12:
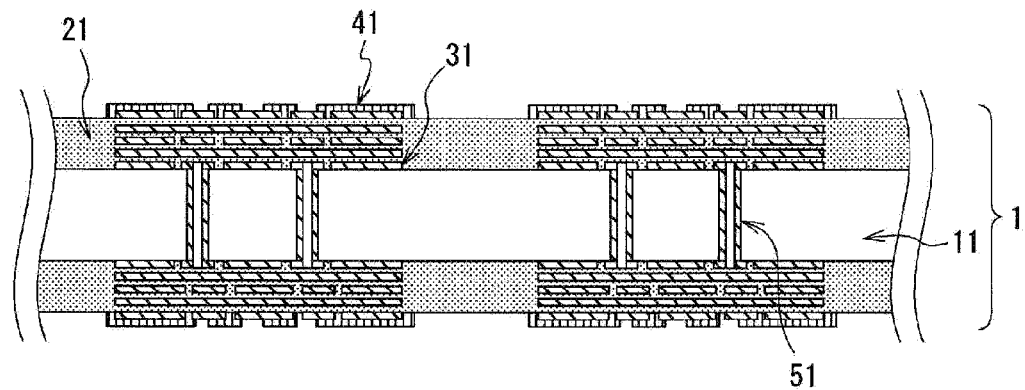
FIG. 12 is a cross-sectional view illustrating a wiring substrate panel before being diced into a package substrate of Example 1.

First, the wiring substrate panel 1 shown in FIG. 12 was produced by steps similar to those in Example 1.

Figure 17A:
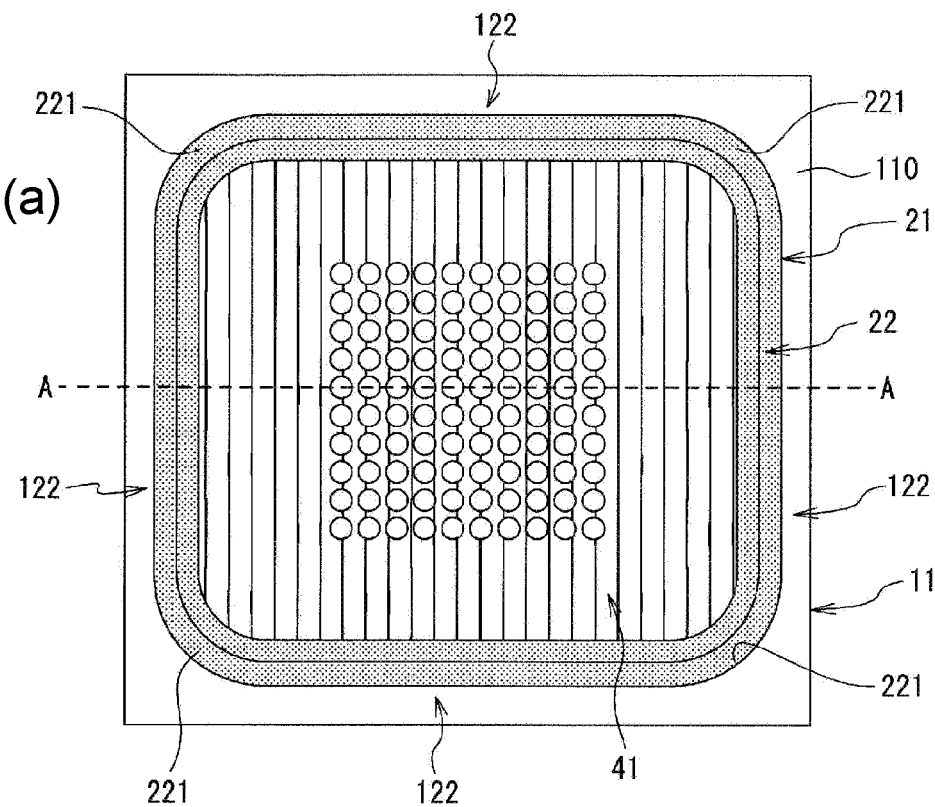
FIGS. 17(a) and 17(b) are a plan view and a cross-sectional view illustrating a package substrate of Example 3.
Figure 17B:
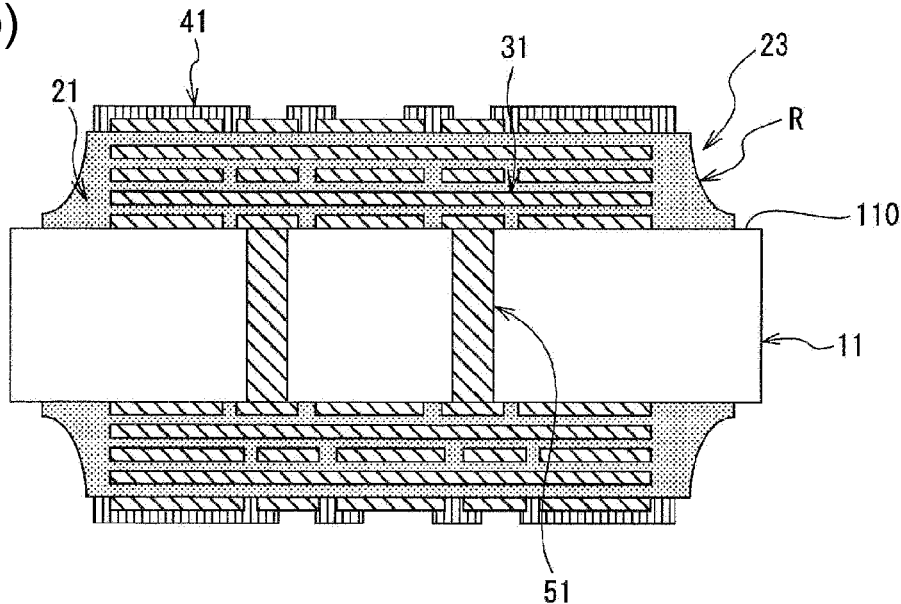

Next, the wiring substrate panel 1 was laser processed to remove a portion of the insulating layer 21 corresponding to an outer periphery of each dice to expose the core substrate 11. At this time, a laser scanning pattern, the number of scans, a scanning speed, and the like were set so that the edge portion of the insulating layer 21 was formed in the desired shape. The laser processing was performed by using a "laser processing apparatus manufactured by ESI". Next, the wiring substrate panel 1 was diced by using the dicing blade 62. Thus, as shown in FIGS. 17(*a*) and (*b*), a package substrate according to the present example was obtained.

In the package substrate according to the present example, the corner portions 221 of the insulating layer 21 had an arc shape in plan view as with the package substrate 400 according to the fourth embodiment (see FIG. 10(*a*)). Furthermore, in the package substrate according to the present example, at least part of the insulating layer 21 (a portion corresponding to the chamfered portion) had a portion having the curvature radius R in cross section similar to that of the package substrate 200 according to the second embodiment (see FIG. 6(*a*)).

Thus, in the present example, the shape of the edge portion of the insulating layer 21, i.e., the chamfered shape, was formed by laser processing. The use of a laser to process the shape of the edge portion of the insulating layer 21 improves the degree of freedom in design and increases the number of possible shapes to be formed, thereby allowing the edge portion of the insulating layer 21 to have the desired shape. For example, the laser processing achieved both the arc shape in plan view of the corner portions of the insulating layer 21 as shown in FIG. 17(*a*) and the arc shape in cross section of at least part of the insulating layer 21 as shown in FIG. 17(*b*). Furthermore, the laser processing enables the edge portion of the insulating layer 21 to have the shape of, for example, any of the chamfered portion 22 shown in FIGS. 3(*a*)-3(*d*), the chamfered portion 23 shown in FIGS. 6(*a*)-6(*d*), and the chamfered portion 24 shown in FIGS. 9(*a*) and 9(*b*).

Example 4

First, the wiring substrate panel 1 shown in FIG. 12 was produced by steps similar to those in Example 1.

Next, as in Example 1, the wiring substrate panel 1 shown in FIG. 13 was laser processed to remove a portion of the insulating layer 21 corresponding to an outer periphery of each dice to expose the core substrate 11.

Figure 18:
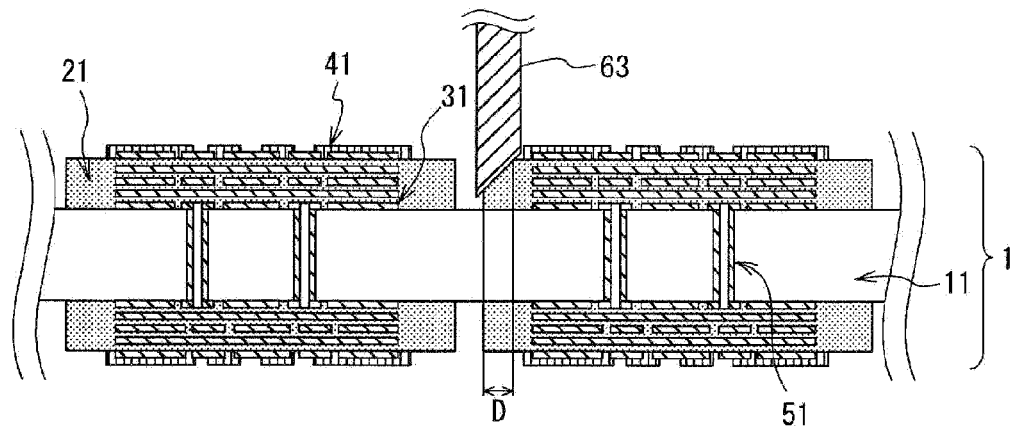
FIG. 18 is a cross-sectional view illustrating a chamfering processing step for a package substrate of Example 4.

Next, as shown in FIG. 18, the insulating layer 21 was chamfered by dicing processing to form a chamfered shape at the edge portion of the insulating layer 21. At this time, a dicing blade 63 having an edge shape with an angle of 45° and a thickness of 0.5 mm was used. In the present example, as the dicing blade 63, an "R07-SD600-BB200 (product name), manufactured by DISCO Corporation" was used. The front and back of the wiring substrate panel 1 were processed while a distance between the tip of the dicing blade 63 and the core substrate 11 was controlled to be in the range of 10 μm or more and 30 μm or less. In order to simultaneously process adjacent pieces in the wiring substrate panel 1, the blade width of the dicing blade 63 was adjusted so that a cutting width D was 100 μm or more and 300 μm or less. Thus, the desired structure was obtained at the edge portion of the insulating layer 21. In the present example, the edge portion of the insulating layer 21 had the same shape as the chamfered portion 22 of the package substrate 100 shown in FIG. 2.

Figure 19:
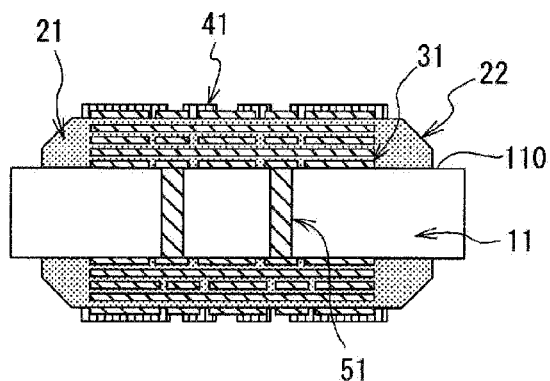
FIG. 19 is a cross-sectional view illustrating the package substrate of Example 4.

Next, as in Example 1, the wiring substrate panel 1 was diced by using the dicing blade 62 (see FIG. 15) to obtain a package substrate of the present example shown in FIG. 19.

Comparative Example 1

First, the wiring substrate panel 1 shown in FIG. 12 was produced as in Example 1.

Next, as in Example 1, as shown in FIG. 13, the wiring substrate panel 1 was laser processed to remove a portion of the insulating layer 21 corresponding to an outer periphery of each dice to expose the core substrate 11.

Figure 20:
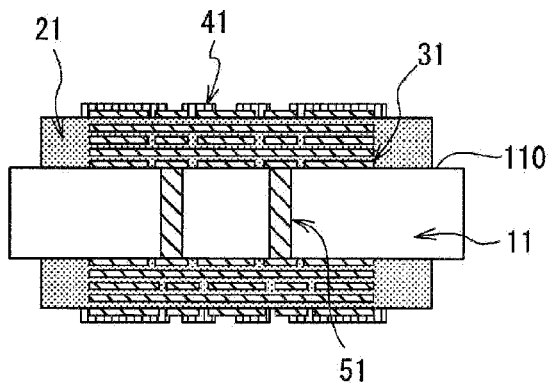
FIG. 20 is a cross-sectional view illustrating a package substrate of Comparative Example 1.

Next, the wiring substrate panel 1 was diced by using the dicing blade 62 to obtain a package substrate of the present comparative example as shown in FIG. 20. The package substrate of the present comparative example differs from the package substrates of Examples 1 to 4 in that no chamfered portion was formed at the edge portion of the insulating layer 21.

(Evaluation)

The package substrates of Examples 1 to 4 and Comparative Example 1 were subjected to a temperature cycle test, and it was evaluated whether breakage occurred in the core substrate 11 during temperature change.

(Temperature Cycle Test)

The package substrates of Examples 1 to 4 and Comparative Example 1 were subjected to pretreatment in accordance with JEDEC (JESD22A113) standard MSL level 3, followed by 1000 cycles of Temperature cycle test condition B (−55° C. or more and 125° C. or less) described in JEDEC standard (JESD22-A104). After the temperature cycle test, the package substrates of Examples 1 to 4 and Comparative Example 1 were checked for the occurrence of breakage. As the results of the temperature cycle test, the case where no breakage occurred in the glass constituting the core substrate 11 was evaluated as "Good", and the case where breakage occurred in the glass constituting the core substrate 11 was evaluated as "Poor".

(Evaluation Results)

Table 1 shows the evaluation results of the temperature cycle test.

TABLE 1

|  | Example 1 | Example 2 | Example 3 | Example 4 | Comparative Example 1 |
| --- | --- | --- | --- | --- | --- |
| Temperature cycle test | Good | Good | Good | Good | Poor |

As shown in Table 1, for the package substrates of Examples 1 to 4, the results of the temperature cycle test were "Good", and it was verified that no breakage occurred in the glass constituting the core substrate 11 during the temperature change.

On the other hand, as shown in Table 1, for the package substrate of Comparative Example 1, the results of the temperature cycle test were "Poor", and it was confirmed that breakage occurred in the glass constituting the core substrate 11 during temperature change.

This verified that according to the package substrate and the method of manufacturing the same of the present invention, since the edge portion of the insulating layer 21 is chamfered, it is possible to relax stress concentration on the edge portion of the insulating layer during temperature change, thereby preventing breakage of the core substrate 11.

Thus, according to the present invention, even when a package substrate that includes a core substrate made of a brittle material and is obtained by dicing a wiring substrate is subjected to significant temperature change or repeated temperature change during production, during mounting, during use, or the like, no breakage occurs in the core substrate. Therefore, the present invention provides an improved and even highly reliable package substrate.

Although the embodiments and examples of the present invention have been described, needless to say, the present invention is not limited to the above description, and without departing from the technical idea, other layers or structures may be optionally formed considering the application as a package substrate and for the purpose of improving other required physical properties such as rigidity, strength, and impact properties.

Although the present invention has been described using specific examples, the present invention is not limited to these descriptions. Various modifications of the disclosed embodiments and other embodiments of the present invention will become apparent to those skilled in the art upon reference to the description of the present invention. Therefore, it should be understood that the claims cover these modifications and embodiments included in the scope and spirit of the present invention.

INDUSTRIAL APPLICABILITY

The present invention can be applied to a semiconductor device including a package substrate such as an interposer interposed between a main substrate and an IC chip.

REFERENCE SIGNS LIST 1, 2 . . . Wiring substrate panel; 11 . . . Core substrate; 21 . . . Insulating layer; 22, 23, 24 . . . Chamfered portion; 22a . . . Lower end; 23a . . . Upper linear portion; 23b . . . Flat portion; 31, 311 . . . Wiring layer; 41 . . . Outer layer insulating resin; 51 . . . Through hole; 61, 62, 63 . . . Dicing blade; 100, 200, 300, 400, 500 . . . Package substrate; 121, 221 . . . Corner portion; 122 . . . Linear portion; 210 . . . First portion; 211 . . . Second portion.

What is claimed is:

1. A package substrate, comprising:
a core substrate consisting of a brittle material;
an insulating layer on a first surface of the core substrate; and
one or more wiring layers on the insulating layer and/or in the insulating layer, wherein
the first surface of the core substrate has an exposed portion at an outer peripheral portion of the core substrate, the insulating layer is not provided on the exposed portion of the first surface of the core substrate, and
the insulating layer is chamfered.

2. The package substrate of claim 1, wherein at least part of the insulating layer has an arc shape curved inward into the insulating layer in cross section.

3. The package substrate of claim 2, wherein a curvature radius of the arc shape of the insulating layer in cross section is 1/20 or more of a thickness of the insulating layer.

4. The package substrate of claim 1, wherein the insulating layer has a multistage structure in cross section, wherein the multistage structure comprises in the order from the first surface of the core substrate a first stage, a second stage and a third stage, wherein a thickness of the first stage is smaller than a thickness of the second stage or a thickness of the third stage.

5. The package substrate of claim 4, wherein the first stage of the multistage structure of the insulating layer from the core substrate has the thickness of 50 μm or less.

6. The package substrate of claim 1, wherein a corner portion of the insulating layer has an arc shape curved inward into the insulating layer in plan view.

7. The package substrate of claim 1, wherein at least one of the one or more wiring layers on the first surface of the core substrate has a thickness of 10 μm or less.

8. The package substrate of claim 1, wherein, a chamfered region of the insulating layer is defined as a chamfered portion, a thickness of the chamfered portion of the insulating layer in a direction perpendicular to the first surface of the core substrate is less than a thickness of the insulating layer in the direction perpendicular to the first surface of the core substrate.

9. The package substrate of claim 1, wherein, when a chamfered region of the insulating layer is defined as a chamfered portion, the chamfered portion is provided in a linear portion of the insulating layer in plan view.

10. The package substrate of claim 1, wherein the core substrate consists of is glass.

11. A method of manufacturing a package substrate comprising a core substrate consisting of a brittle material, an insulating layer on a first surface of the core substrate, and one or more wiring layers on the insulating layer and/or in the insulating layer, the method comprising chamfering the insulating layer, wherein the first surface of the core substrate has an exposed portion at an outer peripheral portion of the core substrate, the insulating layer is not provided on the exposed portion of the first surface of the core substrate.

12. The method of manufacturing a package substrate of claim 11, wherein the chamfering comprises forming a chamfered shape of an edge portion of the insulating layer by laser processing.

13. The method of manufacturing a package substrate of claim 11, wherein the chamfering comprises forming a chamfered shape of an edge portion of the insulating layer by dicing blade processing.

14. The method of manufacturing a package substrate of claim 11, wherein the chamfering comprises forming in the insulating layer an arc shape curved inward into the insulating layer in cross section.

15. The method of manufacturing a package substrate of claim 14, wherein said forming the arc shape comprises setting a curvature radius of the arc shape of the insulating layer in cross section to be 1/20 or more of a thickness of the insulating layer.

16. The method of manufacturing a package substrate of claim 11, further comprising forming an edge portion of the insulating layer in a multistage structure, wherein the multistage structure comprises in the order from the first surface of the core substrate a first stage, a second stage and a third stage, wherein a thickness of the first stage is smaller than a thickness of the second stage or a thickness of the third stage.

17. The method of manufacturing a package substrate of claim 16, wherein the thickness of the first stage of the multistage structure of the insulating layer from the core substrate to be 50 μm or less.

18. The method of manufacturing a package substrate of claim 11, wherein the insulating layer is a multistage structure comprising a plurality of layers and the method further comprises forming edge portions of layers of the plurality of layers of the multistage structure by forming the layers by photolithography using a photosensitive resin to form the layers of the plurality of layers of the multistage structure so that the layers of the plurality of layers of the multistage structure have different resin formation areas.

19. The method of manufacturing a package substrate of claim 11, wherein the chamfering comprises forming a corner portion of the insulating layer in an arc shape curved inward into the insulating layer in plan view.

20. The method of manufacturing a package substrate of claim 11, further comprising setting a thickness of at least one of the one or more wiring layers on the first surface of the core substrate to be 10 μm or less.

21. The method of manufacturing a package substrate of claim 11, wherein, in the chamfering the insulating layer, a chamfer volume of the insulating layer is 30% or more of a volume of a region of the insulating layer in which a distance in a plane direction from an edge of the insulating layer before being chamfered toward a center portion of the insulating layer is not more than a thickness of the insulating layer.

22. The method of manufacturing a package substrate of claim 11, further comprising forming the core substrate by using glass.

* * * * *